(12) United States Patent
Mochizuki et al.

(10) Patent No.: US 10,720,375 B2
(45) Date of Patent: Jul. 21, 2020

(54) SUBSTRATE FOR POWER MODULE, CIRCUIT BOARD FOR POWER MODULE, AND POWER MODULE

(71) Applicant: SUMITOMO BAKELITE CO., LTD., Tokyo (JP)

(72) Inventors: Shunsuke Mochizuki, Tokyo (JP); Kazuya Kitagawa, Tokyo (JP); Yoji Shirato, Tokyo (JP); Keita Nagahashi, Tokyo (JP); Mika Tsuda, Tokyo (JP); Satoshi Maji, Tochigi (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 218 days.

(21) Appl. No.: 15/746,893

(22) PCT Filed: Jul. 20, 2016

(86) PCT No.: PCT/JP2016/071283
§ 371 (c)(1),
(2) Date: Jan. 23, 2018

(87) PCT Pub. No.: WO2017/014237
PCT Pub. Date: Jan. 26, 2017

(65) Prior Publication Data
US 2019/0341331 A1 Nov. 7, 2019

(30) Foreign Application Priority Data
Jul. 23, 2015 (JP) ................................. 2015-146051

(51) Int. Cl.
*H01L 23/373* (2006.01)
*H05K 1/03* (2006.01)
(Continued)

(52) U.S. Cl.
CPC ...... *H01L 23/3735* (2013.01); *H01L 23/3737* (2013.01); *H05K 1/0373* (2013.01);
(Continued)

(58) Field of Classification Search
CPC ... H05K 1/056; H05K 1/0373; H01L 23/3737
See application file for complete search history.

(56) References Cited

U.S. PATENT DOCUMENTS 5,547,758 A   8/1996  Watanabe et al.
5,576,362 A  11/1996  Watanabe et al.
(Continued)

FOREIGN PATENT DOCUMENTS

CN    1844188 A   10/2006
CN  102977551 A    3/2013
(Continued)

OTHER PUBLICATIONS

International Search Report dated Sep. 20, 2016, issued in counterpart application No. PCT/JP2016/071283. (2 pages).
(Continued)

*Primary Examiner* — Charles D Garber
*Assistant Examiner* — Alia Sabur
(74) *Attorney, Agent, or Firm* — Westerman, Hattori, Daniels & Adrian, LLP (57) ABSTRACT

A substrate for a power module (100) of the present invention includes a metal substrate (101), an insulating resin layer (102) provided on the metal substrate (101), and a metal layer (103) provided on the insulating resin layer (102). The insulating resin layer (102) includes a thermosetting resin (A) and inorganic fillers (B) dispersed in the thermosetting resin (A), a maximum value of a dielectric loss ratio of the insulating resin layer (102) at a frequency of 1 kHz and 100° C. to 175° C. is equal to or less than 0.030, and a change in a relative permittivity is equal to or less than 0.10.

16 Claims, 1 Drawing Sheet

(51) Int. Cl.
*H05K 1/05* (2006.01)
*H05K 1/18* (2006.01)
*H01L 23/31* (2006.01)
*H01L 23/00* (2006.01)
*H01L 25/16* (2006.01)

(52) U.S. Cl.
CPC ............. *H05K 1/056* (2013.01); *H05K 1/181* (2013.01); *H01L 23/3121* (2013.01); *H01L 24/48* (2013.01); *H01L 24/73* (2013.01); *H01L 25/16* (2013.01); *H01L 2224/48091* (2013.01); *H01L 2224/73265* (2013.01); *H05K 2201/0209* (2013.01); *H05K 2201/0257* (2013.01)

(56) References Cited

U.S. PATENT DOCUMENTS

| 2002/0096759 | A1  | 7/2002  | Hirano et al. |
| 2005/0221538 | A1* | 10/2005 | Suzuki .................... H01L 23/24 438/126 |
| 2009/0133912 | A1  | 5/2009  | Miyata et al. |
| 2013/0115472 | A1* | 5/2013  | Yu .......................... C08L 65/00 428/463 |
| 2015/0368413 | A1  | 12/2015 | Tatemichi et al. |
| 2017/0127514 | A1* | 5/2017  | Ohki .................... C09D 163/00 |

FOREIGN PATENT DOCUMENTS

| CN | 103342895 A | 10/2013 |
| CN | 104704046 A | 6/2015 |
| JP | 6-44824 A | 2/1994 |
| JP | 8-23146 A | 1/1996 |
| JP | 8-288605 A | 11/1996 |
| JP | 2011-216619 A | 10/2011 |
| JP | 2014-152299 A | 8/2014 |
| JP | 2014-232854 A | 12/2014 |
| WO | 2007/029657 A1 | 3/2007 |

OTHER PUBLICATIONS

Office Action dated Sep. 5, 2018, issued in counterpart Chinese application No. 201680042924.5. (6 pages).
Notification of Transmittal of Translation of the International Preliminary Report on Patentability (Form PCT/IB/338) issued in counterpart International Application No. PCT/JP2016/071283 dated Feb. 1, 2018, with Forms PCT/IB/373 and PCT/ISA/237 (6 pages).
Office Action dated Dec. 19, 2019, issued in counterpart German application No. 11 2016 003 327.3, with English translation. (7 pages).
Hu Huiyu et al., "Temperature-dependence of Dielectric Properties for Copper Clad Laminate used in Integrated Power Module", 2013 Annual Report Conference on Electrical Insulation and Dielectric Phenomena, pp. 887 to 890.
Gorchakov, Sergey et al., "Dielectric and Partial Discharge Investigations on High Power Insulated Gate Bipolar Transistor Modules", IEEE Transactions on Dielectrics and Electrical Insulation, vol. 22, No. 4, Aug. 2015, pp. 1997 to 2007.

\* cited by examiner

SUBSTRATE FOR POWER MODULE, CIRCUIT BOARD FOR POWER MODULE, AND POWER MODULE

TECHNICAL FIELD

The present invention relates to a substrate for a power module, a circuit board for a power module, and a power module.

BACKGROUND ART

Hitherto, power modules constituted by mounting semiconductor elements such as insulated gate bipolar transistors (IGBTs) and diodes, resistors, and electronic components such as capacitors on a circuit board have been known.

These power modules are applied to a variety of instruments depending on the voltage resistance or current capacity thereof. Particularly, from the viewpoint of the recent environmental issues and energy-saving initiative, the use of these power modules in a variety of electric machines has been expanding every year.

Particularly, for in-vehicle power control devices, there is a demand for the installation of power control devices in engine rooms in addition to size reduction and space saving. In engine rooms, the temperature is high and severe environments such as significantly changing temperatures are formed, and thus substrates having a large heat dissipation area are required. In such applications, metal-based circuit boards having more favorable heat dissipation properties are gaining attention.

For example, Patent Document 1 discloses a power module in which a semiconductor element is mounted on a support such as a lead frame, and the support and a heat dissipation plate that is connected to a heat sink are adhered to each other through an insulating resin layer.

RELATED DOCUMENT

Patent Document

[Patent Document 1] Japanese Unexamined Patent Publication No. 2011-216619

SUMMARY OF THE INVENTION

Technical Problem

However, the above-described power modules failed to sufficiently satisfy insulation properties at high temperatures. Therefore, there are cases in which it becomes difficult to maintain the insulation properties of electronic components, and, in such cases, the performance of power modules degrades.

Solution to Problem

According to the present invention,
there is provided a substrate for a power module including
a metal substrate, an insulating resin layer provided on the metal substrate, and a metal layer provided on the insulating resin layer,
in which the insulating resin layer includes a thermosetting resin and inorganic fillers dispersed in the thermosetting resin, and
a maximum value of a dielectric loss ratio of the insulating resin layer at a frequency of 1 kHz and 100° C. to 175° C. is equal to or less than 0.030, and a change in a relative permittivity is equal to or less than 0.10.

In addition, according to the present invention,
there is provided a circuit board for a power module formed by carrying out a circuit process on the metal layer in the substrate for a power module.

Furthermore, according to the present invention,
there is provided a power module including the circuit board for a power module and
an electronic component provided on the circuit board for a power module.

Advantageous Effects of Invention

According to the present invention, it is possible to provide a substrate for a power module and a circuit board for a power module which are capable of realizing power modules having excellent insulation reliability and a power module having excellent insulation reliability.

BRIEF DESCRIPTION OF THE DRAWINGS

The above-described object, other objects, characteristics, and advantages will be further clarified using preferred embodiments described below and the following drawings associated thereto.

DESCRIPTION OF EMBODIMENTS

Hereinafter, embodiments of the present invention will be described on the basis of the drawings. Meanwhile, in all of the drawings, the same constituent element will be given the same reference sign, and the detailed description thereof will not be repeated so as to avoid duplication. In addition, the drawings are schematic views, and dimensional ratios do not coincide with actual ratios. In addition, "to" used to express numerical ranges indicates "equal to or more than and equal to or less than" unless particularly otherwise described.

[Substrate for Power Module]

Figure 1:
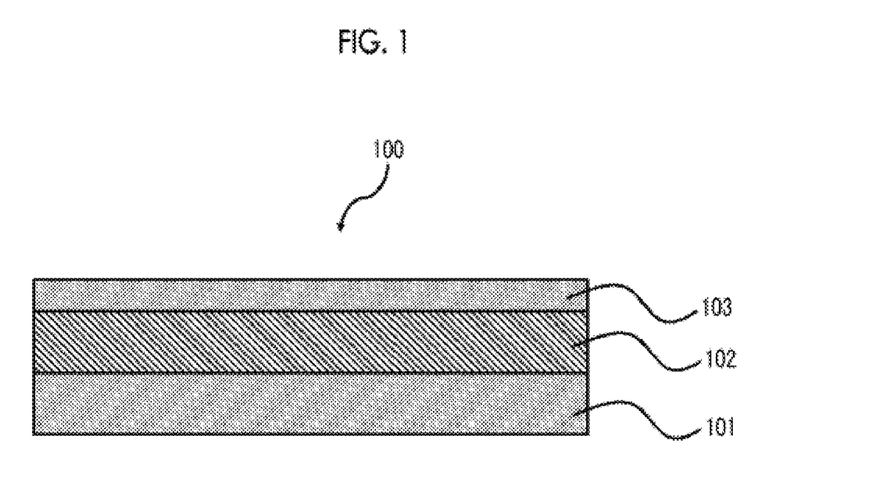
FIG. 1 is a cross-sectional view of a substrate for a power module according to an embodiment of the present invention.

First, a substrate for a power module 100 according to the present embodiment will be described. FIG. 1 is a cross-sectional view of the substrate for a power module 100 according to an embodiment of the present invention.

The substrate for a power module 100 includes a metal substrate 101, an insulating resin layer 102 provided on the metal substrate 101, and a metal layer 103 provided on the insulating resin layer 102.

<Insulating Resin Layer>

The insulating resin layer 102 is a layer for adhering the metal layer 103 to the metal substrate 101.

The insulating resin layer 102 includes a thermosetting resin (A) and inorganic fillers (B) dispersed in the thermosetting resin (A).

In addition, for the insulating resin layer 102, the maximum value of the dielectric loss ratio at a frequency of 1 kHz and 100° C. to 175° C. is equal to or less than 0.030, preferably equal to or less than 0.025, and particularly preferably equal to or less than 0.018, and the change in the relative permittivity is equal to or less than 0.10 and preferably equal to or less than 0.05. The change in the relative permittivity is a value obtained by subtracting the value of the relative permittivity at 100° C. from the value of the relative permittivity at 175° C. The lower limit value of the maximum value of the dielectric loss ratio is not particularly limited and, for example, equal to or more than 0.010. The lower limit value of the change in the relative permittivity is not particularly limited and, for example, equal to or more than 0.01.

Meanwhile, in the present embodiment, the insulating resin layer 102 is obtained by thermally curing a thermosetting resin composition (P) including a thermosetting resin (A) and inorganic fillers (B). That is, the insulating resin layer 102 is in a C-stage form in which the thermally-cured thermosetting resin (A) is included.

Here, the maximum value of the dielectric loss ratio at a frequency of 1 kHz and 100° C. to 175° C. indicates an index of β relaxation in the insulating resin layer 102. That is, as the maximum value of the dielectric loss ratio at 100° C. to 175° C. decreases, the degree of β relaxation decreases. In addition, the change in the relative permittivity indicates an index of the temperature reliance of insulation properties in the insulating resin layer 102. That is, as the change in the relative permittivity decreases, the change in the insulation properties of the insulating resin layer 102 caused by temperature changes decreases.

The dielectric loss ratio and the relative permittivity can be measured using an LCR meter.

The insulating resin layer 102 is provided between the metal substrate 101 and the metal layer 103 and, in power modules, accelerates the thermal conduction from heat generation bodies to heat dissipation bodies. Therefore, faults caused by characteristic alteration in semiconductor chips and the like are suppressed, and the stability of power modules improves.

According to the present inventors' studies, it has been clarified that, when the glass transition temperature of the insulating resin layer 102 is increased, it is possible to improve the insulation properties of the substrate for a power module 100 to a certain extent. However, an increase in the glass transition temperature alone failed to provide sufficient insulation properties at high temperatures.

Therefore, as a result of intensive studies in consideration of the above-described circumstances, the present inventors found that, as the degree of the β relaxation of the insulating resin layer 102 decreases, the insulation properties of the substrate for a power module 100 at high temperatures further improve. The reason therefor is considered that, as the degree of the β relaxation decreases, the motion opening of conductive components in the insulating resin layer 102 at high temperatures is further suppressed.

When the motion opening of conductive components is suppressed, the insulation properties of the insulating resin layer 102 being degraded by an increase in temperature can be suppressed. Therefore, the substrate for a power module 100 according to the present embodiment has excellent insulation properties at high temperatures and is capable of realizing power modules having favorable insulation reliability.

The dielectric loss ratio and the change in the relative permittivity of the insulating resin layer 102 at a frequency of 1 kHz and 100° C. to 175° C. can be controlled by appropriately adjusting the kinds or blending ratios of the respective components constituting the insulating resin layer 102 and the method for producing the insulating resin layer 102.

In the present embodiment, examples of the factors for controlling the dielectric loss ratio and the change in the relative permittivity particularly include the appropriate selection of the kind of the thermosetting resin (A), the aging of a resin varnish to which the thermosetting resin (A) and the inorganic fillers (B) are added, the heating conditions for the aging, and the like.

In the substrate for a power module 100, the total amount of ions in the insulating resin layer 102, which is measured by analyzing extracted water obtained under the following condition using an ion chromatograph is preferably equal to or less than 30,000 ppm and more preferably equal to or less than 20,000 ppm.

Here, the ions are one or more selected from $Li^+$, $Na^+$, $NH_4^+$, $K^+$, $Ca^{2+}$, $Mg^{2+}$, $F^-$, $Cl^-$, $NO_2^{2-}$, $Br^-$, $NO_3^-$, $PO_4^{3-}$, $SO_4^{2-}$, $(COO)_2^{2-}$, $CH_3COO^-$, and $HCOO^-$.

(Condition)

Pure water (40 mL) is added to the frost-shattered insulating resin layer (102) (2 g), and hot water is extracted at 125° C. for 20 hours, thereby obtaining extracted water.

When the total amount of the ions is equal to or less than the upper limit value, it is possible to further improve the insulation properties of the insulating resin layer 102 at high temperatures. In a case in which the amount of ionic impurities in the respective components constituting the insulating resin layer 102 is adjusted, or the inorganic fillers (B) that generates ions by being hydrolyzed is contained, it is possible to adjust the total amount of the ions in the insulating resin layer 102 by selecting the inorganic fillers (B) having a small surface area.

In the substrate for a power module 100, the glass transition temperature of the insulating resin layer 102, which is measured by a dynamic mechanical analysis under conditions of a temperature-increase rate of 5° C./min and a frequency of 1 Hz, is preferably equal to or higher than 175° C. and more preferably equal to or higher than 190° C. The upper limit value of the glass transition temperature is not particularly limited and, for example, equal to or lower than 300° C.

Here, the glass transition temperature (Tg) of the insulating resin layer 102 is measured by a dynamic mechanical analysis (DMA) under conditions of a temperature-increase rate of 5° C./min and a frequency of 1 Hz after removing the metal substrate 101 and the metal layer 103.

When the glass transition temperature is equal to or higher than the lower limit value, it is possible to further suppress the motion opening of conductive components, and thus the degradation of the insulation properties of the insulating resin layer 102 caused by an increase in temperature can be further suppressed. As a result, it is possible to realize power modules having more favorable insulation reliability.

The glass transition temperature can be controlled by appropriately adjusting the kinds or blending ratios of the respective components constituting the insulating resin layer 102 and the method for producing the insulating resin layer 102.

In the insulating resin layer 102, the volume resistivity at 175° C., which is on the basis of JIS K6911 and is measured one minute after the application of a voltage at an applied voltage of 1,000 V, is preferably equal to or more than $1.0 \times 10^8$ Ω·m, more preferably equal to or more than $1.0 \times 10^9$ Ω·m, and particularly preferably equal to or more than $1.0 \times 10^{10}$ Ω·m. The upper limit value of the volume resistivity at 175° C. is not particularly limited and is, for example, $1.0 \times 10^{13}$ Ω·m.

Here, the volume resistivity at 175° C. of the insulating resin layer 102 represents an index of the insulation properties of the insulating resin layer 102 at high temperatures. That is, as the volume resistivity at 175° C. increases, the insulation properties at high temperatures become more favorable.

The volume resistivity at 175° C. of the insulating resin layer 102 can be controlled by appropriately adjusting the kinds or blending ratios of the respective components constituting the insulating resin layer 102 and the method for preparing the insulating resin layer 102.

In the present embodiment, examples of the factors for controlling the volume resistivity at 175° C. particularly include the appropriate selection of the kind of the thermosetting resin (A), the aging of a resin varnish to which the thermosetting resin (A) and the inorganic fillers (B) are added, the heating conditions for the aging, and the like.

The thickness of the insulating resin layer 102 is appropriately set depending on the purpose. Since it is possible to improve the mechanical strength or the thermal resistance and more effectively transfer heat from electronic components to the metal substrate 101, the thickness of insulating resin layer 102 is preferably equal to or more than 40 μm and equal to or less than 400 μm, and, since the balance between the heat dissipation properties and the insulation properties throughout the entire substrate for a power module 100 is more favorable, the thickness of insulating resin layer 102 is more preferably set to equal to or more than 100 μm and equal to or less than 300 μm.

When the thickness of insulating resin layer 102 is set to equal to or less than the upper limit value, it is possible to facilitate the transfer of heat from electronic components to the metal substrate 101.

In addition, when the thickness of insulating resin layer 102 is set to equal to or more than the lower limit value, it is possible to sufficiently relax the generation of thermal stress attributed to the thermal expansion coefficient difference between the metal substrate 101 and the insulating resin layer 102 in the insulating resin layer 102. Furthermore, the insulation properties of the substrate for a power module 100 improve.

The insulating resin layer 102 includes a thermosetting resin (A) and inorganic fillers (B) dispersed in the thermosetting resin (A).

(Thermosetting Resin (A))

Examples of the thermosetting resin (A) include epoxy resins having a dicyclopentadiene skeleton, epoxy resins having a biphenyl skeleton, epoxy resins having an adamantane skeleton, epoxy resins having a phenol aralkyl skeleton, epoxy resins having a biphenyl aralkyl skeleton, epoxy resins having a naphthalene aralkyl skeleton, cyanate resins, and the like.

As the thermosetting resin (A), one of these resins may be used singly or two or more resins may be jointly used.

When the above-described thermosetting resin (A) is used, the glass transition temperature of the insulating resin layer 102 increases, and it is possible to decrease the dielectric loss ratio at a frequency of 1 kHz and 100° C. to 175° C. and the change in the relative permittivity.

Among the thermosetting resins (A), from the viewpoint of further decreasing the dielectric loss ratio, epoxy resins having a dicyclopentadiene skeleton are particularly preferred.

The content of the thermosetting resin (A) in the insulating resin layer 102 is preferably equal to or more than 1% by mass and equal to or less than 30% by mass and more preferably equal to or more than 5% by mass and equal to or less than 28% by mass with respect to 100% by mass of the insulating resin layer (102). When the content of the thermosetting resin (A) is equal to or more than the lower limit value, the handling properties improve, and it becomes easy to form the insulating resin layer 102. When the content of the thermosetting resin (A) is equal to or less than the upper limit value, the strength or flame resistance of the insulating resin layer 102 further improves or the thermal conduction properties of the insulating resin layer 102 further improves.

(Inorganic Fillers (B))

Examples of the inorganic fillers (B) include silica, alumina, boron nitride, aluminum nitride, silicon nitride, silicon carbide, and the like. These inorganic fillers may be used singly or two or more inorganic fillers may be jointly used.

From the viewpoint of further improving the thermal conduction properties of the insulating resin layer 102, the inorganic fillers (B) are preferably secondary agglomerated particles that are formed by agglomerating the primary particles of scale-like boron nitride.

The secondary agglomerated particles that are formed by agglomerating the scale-like boron nitride can be formed by, for example, agglomerating scale-like boron nitride using a spray drying method or the like and then firing the boron nitride. The firing temperature is, for example, 1,200° C. to 2,500° C.

In a case in which the secondary agglomerated particles that are obtained by firing scale-like boron nitride are used as described above, from the viewpoint of improving the dispersibility of the inorganic fillers (B) in the thermosetting resin (A), the thermosetting resin (A) is particularly preferably an epoxy resin having a dicyclopentadiene skeleton.

The average particle diameter of the secondary agglomerated particles that are formed by agglomerating scale-like boron nitride is, for example, preferably equal to or more than 5 μm and equal to or less than 180 μm and more preferably equal to or more than 10 μm and equal to or less than 100 μm. In such a case, it is possible to realize the insulating resin layer 102 being more favorable in terms of the balance between the thermal conduction properties and the insulation properties.

The average long diameter of the primary particles of scale-like boron nitride which constitute the secondary agglomerated particles is preferably equal to or more than 0.01 μm and equal to or less than 20 μm and more preferably equal to or more than 0.1 μm and equal to or less than 10 μm. In such a case, it is possible to realize the insulating resin layer 102 being more favorable in terms of the balance between the thermal conduction properties and the insulation properties.

Meanwhile, this average long diameter can be measured using an electron microscope photograph. For example, the average long diameter is measured in the following order. First, samples are produced by cutting the secondary agglomerated particles using a microtome or the like. Next, several cross-sectional photographs of the secondary agglomerated particles magnified to several thousand times are captured using a scanning electron microscope. Next, arbitrary secondary agglomerated particles are selected, and the long diameters of the primary particles of the scale-like boron nitride are measured from the photographs. At this time, the long diameters of ten or more primary particles are measured, and the average value thereof is considered as the average long diameter.

The content of the inorganic fillers (B) in the insulating resin layer 102 is preferably equal to or more than 50% by mass and equal to or less than 95% by mass, more preferably equal to or more than 55% by mass and equal to or less than 88% by mass, and particularly preferably equal to or more than 60% by mass and equal to or less than 80% by mass with respect to 100% by mass of the insulating resin layer (102).

When the content of the inorganic fillers (B) is equal to or more than the lower limit value, it is possible to more effectively improve the thermal conduction properties or the mechanical strength of the insulating resin layer 102. Meanwhile, when the content of the inorganic fillers (B) is equal to or less than the upper limit value, the film formation properties or the workability of the thermosetting resin composition (P) are improved, and it is possible to further improve the uniformity of the film thickness of the insulating resin layer 102.

From the viewpoint of further improving the thermal conduction properties of the insulating resin layer 102, the inorganic fillers (B) according to the present embodiment preferably further includes, in addition to the secondary agglomerated particles, the primary particles of scale-like boron nitride which are different from the primary particles of scale-like boron nitride which constitute the secondary agglomerated particles. The average long diameter of the primary particles of scale-like boron nitride is preferably equal to or more than 0.01 µm and equal to or less than 20 µm and more preferably equal to or more than 0.1 µm and equal to or less than 10 µm.

In such a case, it is possible to realize the insulating resin layer 102 being more favorable in terms of the balance between the thermal conduction properties and the insulation properties.

(Curing Agent (C))

In a case in which an epoxy resin is used as the thermosetting resin (A), the insulating resin layer 102 preferably further includes a curing agent (C).

As the curing agent (C), it is possible to use one or more selected from a curing catalyst (C-1) and a phenol-based curing agent (C-2).

Examples of the curing catalyst (C-1) include organic metal salts such as zinc naphthenate, cobalt naphthenate, tin octylate, cobalt octylate, cobalt (II) bisacetylacetonate, and cobalt (III) trisacetylacetonate; tertiary amines such as triethylamine, tributylamine, and 1,4-diazabicyclo[2.2.2]octane; imidazoles such as 2-phenyl-4-methylimidazole, 2-ethyl-4-methylimidazole, 2,4-diethylimidazole, 2-phenyl-4-methyl-5-hydroxyimidazole, and 2-phenyl-4,5-dihydroxymethylimidazole; organic phosphorus compounds such as triphenylphosphine, tri-p-tolylphosphine, tetraphenylphosphonium•tetraphenylborate, triphenylphosphine•triphenylborane, 1,2-bis-(diphenylphosphino)ethane; phenol compounds such as phenol, bisphenol A, and nonylphenol; organic acids such as acetic acid, benzoic acid, salicylic acid, and p-toluenesulfonic acid; and the like; and mixtures thereof. As the curing catalyst (C-1), one of these, including derivatives thereof, may be used singly or two or more of these, including derivatives thereof, may be jointly used.

The content of the curing catalyst (C-1) in the insulating resin layer 102 is not particularly limited, but is preferably equal to or more than 0.001% by mass and equal to or less than 1% by mass with respect to 100% by mass of the insulating resin layer 102.

In addition, examples of the phenol-based curing agent (C-2) include novolac-type phenolic resins such as phenol novolac resins, cresol novolac resins, naphthol novolac resins, aminotriazine novolac resins, novolac resins, and trisphenylmethane-type phenolic novolac resins; modified phenolic resins such as terpene-modified phenolic resins and dicyclopentadiene-modified phenolic resins; aralkyl-type resins such as phenol aralkyl resins having a phenylene skeleton and/or a biphenylene skeleton and naphthol aralkyl resins having a phenylene skeleton and/or a biphenylene skeleton; bisphenol compounds such as bisphenol A and bisphenol F; resol-type phenol resins; and the like, and one of these may be used singly or two or more of these may be jointly used.

Among these, from the viewpoint of improving the glass transition temperature and decreasing the linear expansion coefficient, the phenol-based curing agent (C-2) is preferably a novolac-type phenolic resin or a resol-type phenolic resin.

The content of the phenol-based curing agent (C-2) is not particularly limited, but is preferably equal to or more than 1% by mass and equal to or less than 30% by mass and more preferably equal to or more than 5% by mass and equal to or less than 20% by mass with respect to 100% by mass of the insulating resin layer 102.

(Coupling Agent (D))

The insulating resin layer 102 may further include a coupling agent (D).

The coupling agent (D) is capable of improving the wetting properties of the interface between the thermosetting resin (A) and the inorganic fillers (B).

As the coupling agent (D), any coupling agents that are ordinarily used can be used, and specifically, one or more coupling agents selected from epoxysilane coupling agents, cationic silane coupling agents, aminosilane coupling agents, titanate-based coupling agents, and silicone oil-type coupling agent are preferably used.

The amount of the coupling agent (D) added is dependent on the specific surface area of the inorganic fillers (B) and is thus not particularly limited, but is preferably equal to or more than 0.1% by mass and equal to or less than 10% by mass and particularly preferably equal to or more than 0.5% by mass and equal to or less than 7% by mass with respect to 100% by mass of the inorganic fillers (B).

(Phenoxy Resin (E))

The insulating resin layer 102 may further include a phenoxy resin (E). When the insulating resin layer includes the phenoxy resin (E), it is possible to further improve the flex resistance of the substrate for a power module 100.

In addition, when the insulating resin layer includes the phenoxy resin (E), it becomes possible to decrease the elastic modulus of the insulating resin layer 102, and it is possible to improve the stress relaxation capability of the substrate for a power module 100.

In addition, when the insulating resin layer includes the phenoxy resin (E), the fluidity is decreased due to an increase in the viscosity, and the generation of voids and the like can be suppressed. In addition, it is possible to improve the adhesiveness between the insulating resin layer 102 and the metal substrate 101 or the metal layer 103. With the above-described synergetic effect, it is possible to further enhance the insulation reliability of power modules.

Examples of the phenoxy resin (E) include phenoxy resins having a bisphenol skeleton, phenoxy resins having a naphthalene skeleton, phenoxy resins having an anthracene skeleton, phenoxy resins having a biphenyl skeleton, and the like. In addition, it is also possible to use phenoxy resins having a structure having a plurality of kinds of the above-described skeleton.

The content of the phenoxy resin (E) is, for example, equal to or more than 3% by mass and equal to or less than 10% by mass with respect to 100% by mass of the insulating resin layer (102).

(Other Components)

The insulating resin layer 102 may include an antioxidant, a leveling agent, and the like as long as the effects of the present invention are not impaired.

The insulating resin layer 102 can be produced, for example, as described below.

First, the respective components described above are added to a solvent, thereby obtaining a varnish-form thermosetting resin composition (P). In the present embodiment, for example, after the thermosetting resin (A) and the like are added to a solvent so as to produce a resin varnish, the inorganic fillers (B) are added to the resin varnish, and the components are stirred using three rolls or the like, whereby a varnish-form thermosetting resin composition (P) can be obtained. In such a case, it is possible to disperse the inorganic fillers (B) more uniformly in the thermosetting resin (A).

The solvent is not particularly limited, and examples thereof include methyl ethyl ketone, methyl isobutyl ketone, propylene glycol monomethyl ether, cyclohexanone, and the like.

Next, the thermosetting resin composition (P) is aged. Therefore, for the insulating resin layer 102 to be obtained, it is possible to decrease the dielectric loss ratio at a frequency of 1 kHz and 100° C. to 175° C. and the change in the relative permittivity. This is assumed to be because the aging increases the affinity of the inorganic fillers (B) to the thermosetting resin (A). The aging can be carried out under conditions of, for example, 30° C. to 80° C. and 12 to 24 hours.

Next, the thermosetting resin composition (P) is formed to a sheet shape, thereby forming the insulating resin layer 102. In the present embodiment, for example, a varnish-form thermosetting resin composition (P) is applied onto a base material and then thermally treated and dried, whereby the insulating resin layer 102 can be obtained. Examples of the base material include the metal substrate 101, the metal layer 103, and metal foils constituting peelable carrier materials or the like. In addition, the thermal treatment for drying the thermosetting resin composition (P) is carried out under conditions of, for example, 80° C. to 150° C. and five minutes to one hour.

<Metal Substrate>

The metal substrate 101 has a role of dissipating heat accumulated in the substrate for a power module 100. The metal substrate 101 is not particularly limited as long as the metal substrate is a heat-dissipating metal substrate, examples thereof include copper substrates, copper alloy substrates, aluminum substrates, and aluminum alloy substrates, copper substrates or aluminum substrates are preferred, and copper substrates are more preferred. When copper substrates or aluminum substrates are used, it is possible to improve the heat dissipation properties of the metal substrate 101.

The thickness of the metal substrate 101 can be appropriately set as long as the object of the present invention is not impaired.

The upper limit value of the thickness of the metal substrate 101 is, for example, equal to or less than 20.0 mm and preferably equal to or less than 5.0 mm. When the metal substrate 101 having a thickness that is equal to or less than this numerical value is used, it is possible to reduce the thickness of the entire substrate for a power module 100. In addition, it is possible to improve the processability in the outer form process, cutting process, or the like of the substrate for a power module 100.

In addition, the lower limit value of the thickness of the metal substrate 101 is, for example, equal to or more than 0.1 mm, preferably equal to or more than 1.0 mm, and more preferably equal to or more than 2.0 mm. When the metal substrate 101 having a thickness that is equal to or more than this numerical value is used, it is possible to improve the heat dissipation properties of the entire substrate for a power module 100.

<Metal Layer>

The metal layer 103 is provided on the insulating resin layer 102 and is circuit-processed.

Examples of metal constituting the metal layer 103 include one or more selected from copper, copper alloys, aluminum, aluminum alloys, nickel, iron, tin, and the like. Among these, the metal constituting the metal layer 103 is preferably copper or aluminum and particularly preferably copper. When copper or aluminum is used, it is possible to improve the circuit processability of the metal layer 103.

The lower limit value of the thickness of the metal layer 103 is, for example, equal to or more than 0.01 mm, preferably equal to or more than 0.10 mm, and more preferably equal to or more than 0.25 mm. When the thickness is equal to or more than the above-described numerical value, it is possible to suppress the generation of heat from circuit patterns even in applications in which high currents are required.

In addition, the upper limit value of the thickness of the metal layer 103 is, for example, equal to or less than 2.0 mm, preferably equal to or less than 1.5 mm, and more preferably equal to or less than 1.0 mm. When the thickness is equal to or less than the above-described numerical value, it is possible to improve the circuit processability and reduce the thickness of the entire substrate.

As the metal layer 103, metal foils that can be procured in a plate shape may be used or metal foils that can be procured in a roll shape may be used.

<Method for Manufacturing Substrate for Power Module>

The above-described substrate for a power module 100 can be manufactured, for example, as described below.

First, the varnish-form thermosetting resin composition (P) is applied onto a carrier material and then thermally treated and dried so as to form a resin layer, thereby obtaining a resin layer-attached carrier material.

The carrier material is, for example, a resin film of polyethylene terephthalate (PET) or the like; a metal foil such as a copper foil; or the like. The thickness of the carrier material is, for example, 10 to 500 µm.

Next, the resin layer-attached carrier material is laminated on the metal substrate 101 so that the resin surface-side surface of the resin layer-attached carrier material comes into contact with the surface of the metal substrate 101. After that, the resin layer is pressurized and heated using a press or the like and is adhered thereto in a B-stage state.

Next, the carrier material is removed from the resin layer in a B-stage state, and the metal layer 103 is formed on the exposed surface of the resin layer, thereby obtaining a laminate.

Meanwhile, in a case in which a metal foil is used as the carrier material, it is possible to use this carrier material as the metal layer 103. That is, in this case, after the resin layer-attached metal layer 103 is obtained, the resin layer-attached metal layer 103 is laminated on the metal substrate 101, whereby an intended laminate is obtained.

Next, the laminate is pressurized and heated using a press or the like so as to heat and cure the resin layer, whereby the insulating resin layer 102 is formed, and the substrate for a power module 100 is obtained.

Meanwhile, hitherto, a manufacturing method in which the resin layer-attached carrier material is laminated on the metal substrate 101 has been described; however, in the present embodiment, it is also possible to laminate the resin layer-attached carrier material on the metal layer 103, remove the carrier material, and then join the resin layer to the metal substrate 101.

In addition, in a case in which a metal foil is used as the carrier material, and the metal foil is used as the metal layer 103, it is possible to use a metal foil extruded from a roll and preferably a copper foil or an aluminum foil extruded from a roll as the metal layer 103.

With the above-described process, it is possible to improve the production efficiency.

[Circuit Board for Power Module]

In the obtained substrate for a power module 100, the metal layer 103 is etched or the like into a predetermined pattern so as to carry out a circuit process, whereby a circuit board for a power module can be obtained.

In addition, it is also possible to forma solder resist 10 (refer to FIG. 2) in the outermost layer and expose an electrode portion for connection so that electronic components can be mounted by means of exposure and development.

[Power Module]

Figure 2:
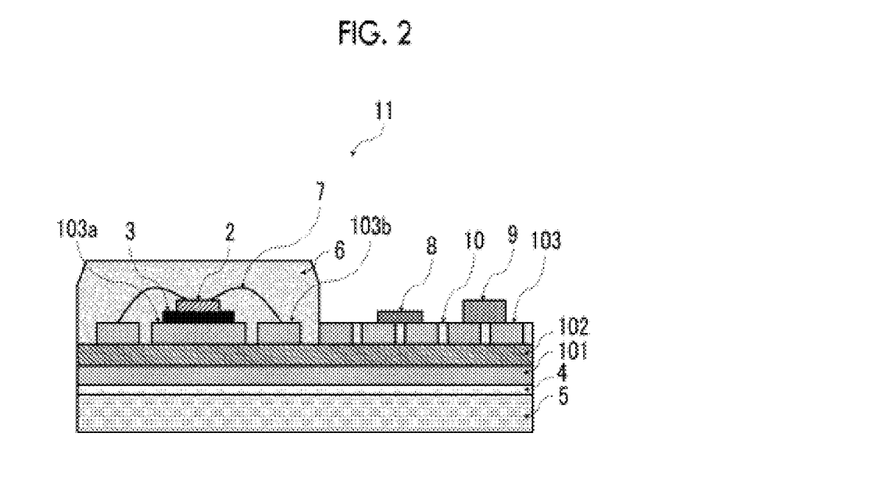
FIG. 2 is a cross-sectional view of a power module according to an embodiment of the present invention.

Next, a power module 11 according to the present embodiment will be described. FIG. 2 is a cross-sectional view of the power module 11 according to an embodiment of the present invention.

When electronic components are provided on the circuit board for a power module according to the present embodiment, the power module 11 can be obtained.

In the present invention, the power module 11 is a semiconductor device, and examples thereof include power semiconductor devices, LED lights, and inverter devices.

Here, inverter devices refer to devices that electrically generate alternating-current power from direct-current power (have an inverse transformation function). In addition, power semiconductor devices refer to devices which have characteristics of higher pressure resistance, higher currents, higher rates, and higher frequencies than those of ordinary semiconductor elements and are generally referred to as power devices and on which electronic components such as rectifier diodes, power transistors, power MOSFET, insulated gate bipolar transistors (IGBT), thyristors, gate turnoff thyristors (GTO), and triac are mounted.

The electronic components refer to a variety of heat generation elements such as semiconductor elements such as insulated gate bipolar transistors, diodes, and IC chips, resistance, and capacitors. The substrate for a power module 100 functions as a heat spreader.

Here, an example of the power module 11 will be described with reference to FIG. 2.

In the power module 11 of the present embodiment, an IC chip 2 is mounted on a metal layer 103a in a circuit board for a power module through an adhesive layer 3. The IC chip 2 is connected to a metal layer 103b through a bonding wire 7.

In addition, the IC chip 2, the bonding wire 7, and the metal layers 103a and 103b are sealed with a sealing material 6.

In addition, in the power module 11, a chip capacitor 8 and a chip resistance 9 are mounted on the metal layer 103. As the chip capacitor 8 and the chip resistance 9, chip capacitors and chip resistances which have been well known in the related art can be used.

In addition, the metal substrate 101 in the power module 11 is connected to a heat dissipation fin 5 through a thermal conductive grease 4. That is, heat can be removed by conducting heat emitted from the IC chip 2 to the heat dissipation fin 5 through the adhesive layer 3, the metal layer 103a, the insulating resin layer 102, the metal substrate 101, and the thermal conductive grease 4.

Meanwhile, the present invention is not limited to the above-described embodiments, and modifications, improvements, and the like are included in the scope of the present invention as long as the object of the present invention can be achieved.

EXAMPLES

Hereinafter, the present invention will be described using examples and comparative examples, but the present invention is not limited thereto. Meanwhile, in the examples, unless particularly described otherwise, 'parts' indicates "parts by mass". In addition, individual thicknesses indicate average film thicknesses.

(Production of Agglomerated Boron Nitride)

A mixture obtained by mixing melamine borate and scale-like boron nitride powder (average long diameter: 15 μm) was added to an aqueous solution of ammonium polyacrylate, and the components were mixed together for two hours, thereby preparing a slurry for spraying. Next, this slurry was supplied to a spraying granulator and was sprayed under conditions of a rotation speed of an atomizer of 15,000 rpm, a temperature of 200° C., and a slurry supply amount of 5 ml/min, thereby producing complex particles. Next, the obtained complex particles are fired in a nitrogen atmosphere under a condition of 2,000° C., thereby obtaining agglomerated boron nitride having an average particle diameter of 80 μm.

Here, the average particle diameter of the agglomerated boron nitride was obtained by measuring the volume-based particle size distribution of the particles using a laser diffraction-type particle size distribution measurement instrument (manufactured by Horiba, Ltd., LA-500) and computing the median diameter ($D_{50}$) thereof.

(Production of Substrate for Power Module)

In Examples 1 to 7 and Comparative Examples 1 and 2, substrates for a power module were produced in the following manner.

First, according to a formulation shown in Table 1, a thermosetting resin and a curing agent were added to methyl ethyl ketone which was a solvent and stirred together, thereby obtaining a solution of a thermosetting resin composition. Next, inorganic fillers were added to this solution, and the components were preliminarily mixed together and then kneaded using three rolls, thereby obtaining a varnish-form thermosetting resin composition in which the inorganic fillers were uniformly dispersed. Next, the obtained thermosetting resin composition was aged under conditions of 60° C. and 15 hours. Next, the thermosetting resin composition was applied onto a copper foil (thickness: 0.07 mm, manufactured by Furukawa Electric Co., Ltd., GTS-MP foil) using a doctor blade method, and then dried by a 30-minute thermal treatment at 100° C., thereby producing a resin layer-attached copper foil.

Next, the obtained resin layer-attached copper foil and a 3.0 mm-thick copper plate (tough pitch copper) were stuck together and pressed using a vacuum press under conditions of a pressing pressure of 100 kg/cm$^2$, 180° C., and 40 minutes, thereby obtaining a substrate for a power module (the thickness of the insulating resin layer 102: 200 μm).

Meanwhile, the details of the respective components in Table 1 are as described below.

In Comparative Example 3, a substrate for a power module was produced in the same manner as in Example 1 except for the fact that the thermosetting resin composition was not aged.

Meanwhile, the details of the respective components in Table 1 are as described below.

(Thermosetting Resin (A))

Epoxy resin 1: An epoxy resin having a dicyclopentadiene skeleton (XD-1000, manufactured by Nippon Kayaku Co., Ltd.)

Epoxy resin 2: An epoxy resin having a biphenyl skeleton (YX-4000, manufactured by Mitsubishi Chemical Industries Corporation)

Epoxy resin 3: An epoxy resin having an adamantane skeleton (E201, manufactured by Idemitsu Kosan Co., Ltd.)

Epoxy resin 4: An epoxy resin having a phenol aralkyl skeleton (NC-2000-L, manufactured by Nippon Kayaku Co., Ltd.)

Epoxy resin 5: An epoxy resin having a biphenyl aralkyl skeleton (NC-3000, manufactured by Nippon Kayaku Co., Ltd.)

Epoxy resin 6: An epoxy resin having a naphthalene aralkyl skeleton (NC-7000, manufactured by Nippon Kayaku Co., Ltd.)

Epoxy resin 7: A bisphenol F-type epoxy resin (830S, manufactured by DIC Corporation)

Epoxy resin 8: A bisphenol A-type epoxy resin (828, manufactured by Mitsubishi Chemical Industries Corporation)

Cyanate resin 1: A phenol novolac-type cyanate resin (PT-30, manufactured by Lonza Japan)

(Curing Catalyst C-1)

Curing catalyst 1: 2-Phenyl-4,5-dihydroxymethylimidazole (2PHZ-PW, manufactured by Shikoku Chemicals Corporation)

Curing catalyst 2: Triphenylphosphine (manufactured by Hokko Chemical Industry Co., Ltd.)

(Curing Catalyst C-2)

Phenol-based curing agent 1: Trisphenylmethane-type phenol novolac resin (MEH-7500, manufactured by Meiwa Plastic Industries, Ltd.)

(Inorganic Fillers (B))

Fillers 1: Agglomerated boron nitride produced by the above-described production example (Measurement of Dielectric Loss Ratio and Change in Relative Permittivity)

The dielectric loss ratios and the changes in the relative permittivity of the insulating resin layers were measured as described below. First, the metal plate and the metal layer were peeled off from the obtained substrate for a power module, thereby obtaining the insulating resin layer.

A main electrode having $\varphi$ of 18 mm was formed on the obtained insulating resin layer using conductive paste. In addition, a guard electrode having $\varphi$ of 26 mm was formed so that the distance between the main electrode and the guard electrode reached 1 mm. Furthermore, a counter electrode having $\varphi$ of 26 mm was formed on the surface on a side opposite to the main electrode. As a testing device, a precision LCR meter HP-4284A manufactured by Agilent Technologies was used. The effective voltage was 1 V, the frequency was fixed to 1 kHz, the dielectric loss ratio and the relative permittivity were measured respectively in a range of 30° C. to 200° C., and the maximum value of the dielectric loss ratio at 100° C. to 175° C. and the change in the relative permittivity were computed.

(Measurement of Glass Transition Temperature (Tg))

The glass transition temperatures of the insulating resin layers were measured as described below. First, the metal plate and the metal layer were peeled off from the obtained substrate for a power module, thereby obtaining the insulating resin layer.

Next, the glass transition temperature (Tg) of the obtained insulating resin layer was measured by a dynamic mechanical analysis (DMA) under conditions of a temperature-increase rate of 5° C./min and a frequency of 1 Hz.

(Measurement of Total Amount of Ions)

The total amounts of ions in the insulating resin layers were measured as described below. First, the metal plate and the metal layer were peeled off from the obtained substrate for a power module, thereby obtaining the insulating resin layer. Next, the obtained insulating resin layer was frost-shattered. Pure water (40 mL) was added to the frost-shattered insulating resin layer (2 g), and hot water was extracted at 125° C. for 20 hours, thereby obtaining extracted water.

For this extracted water, the total amount of one or more ions selected from $Li^+$, $Na^+$, $NH_4^+$, $K^+$, $Ca^{2+}$, $Mg^{2+}$, $F^-$, $Cl^-$, $NO_2^{2-}$, $Br^-$, $NO_3^-$, $PO_4^{3-}$, $SO_4^{2-}$, $(COO)_2^{2-}$, $CH_3COO^-$, and $HCOO^-$ was measured using DIONEX ICS-3000-type, ICS-2000-type, and DX-320-type ion chromatograph devices.

Here, a test liquid and a standard solution were introduced into the ion chromatograph device, the concentrations of the respective ions were obtained using a calibration curve method, and the amount of eluted ions was computed from the specimen.

(Measurement of Volume Resistivity at 25° C. and 175° C.)

The volume resistivity of the insulating resin layer was measured as described below. First, the metal plate and the metal layer were peeled off from the obtained substrate for a power module, thereby obtaining the insulating resin layer. Next, the volume resistivity of the obtained insulating resin layer was measured using an ULTRA HIGH RESISTANCE METER R8340A (manufactured by ADC Corporation) according to JIS K6911 one minute after the application of a voltage at an applied voltage of 1,000 V.

Meanwhile, a main electrode was produced to a circular shape having $\varphi$ of 25.4 mm using conductive paste. In addition, no guard electrode was produced at this time. Furthermore, a counter electrode having $\varphi$ of 26 mm was formed on the surface on a side opposite to the main electrode.

(Insulation Reliability Evaluation)

For each of Examples 1 to 7 and Comparative Examples 1 to 3, the insulation reliability of the power modules was evaluated as described below. First, a power module illustrated in FIG. 2 was produced using the substrate for a power module. As the IC chip, an IGBT chip was used. As the bonding wire, a Cu bonding wire was used. Next, the continuous humid insulation resistance was evaluated under conditions of a temperature of 85° C. a humidity of 85%, and an alternating applied voltage of 1.5 kV using the power module. Meanwhile, resistance values of equal to or less than $10^6 \Omega$ were considered as faults. The evaluation standards are as described below.

A: Faults did not occur for equal to or longer than 300 hours.

B: Faults occurred for equal to or longer than 200 hours and shorter than 300 hours.

C: Faults occurred for equal to or longer than 150 hours and shorter than 200 hours.

D: Faults occurred for equal to or longer than 100 hours and shorter than 150 hours.

E: Faults occurred within shorter than 100 hours.

TABLE 1

| | | | Unit | Example 1 | Example 2 | Example 3 | Example 4 | Example 5 |
|---|---|---|---|---|---|---|---|---|
| Resin composition | Thermosetting resin | Epoxy resin 1 | g | 18.9 | — | — | — | — |
| | | Epoxy resin 2 | g | — | 9.0 | 8.6 | — | — |
| | | Epoxy resin 3 | g | — | — | 8.9 | — | — |
| | | Epoxy resin 4 | g | — | — | — | 18.6 | — |
| | | Epoxy resin 5 | g | — | — | — | — | 19.4 |
| | | Epoxy resin 6 | g | — | — | — | — | — |
| | | Epoxy resin 7 | g | — | — | — | — | — |
| | | Epoxy resin 8 | g | — | — | — | — | — |
| | | Cyanate resin 1 | g | — | — | — | — | — |
| | Curing agent | Phenol-based curing agent 1 | g | 7.3 | 17.2 | 8.8 | 7.6 | 6.8 |
| | | Curing catalyst 1 | g | 0.1 | 0.1 | 0.1 | 0.1 | 0.1 |
| | | Curing catalyst 2 | g | — | — | — | — | — |
| | Inorganic fillers | Fillers 1 | g | 73.8 | 73.8 | 73.8 | 73.8 | 73.8 |
| Maximum value of dielectric loss ratio at 100° C. to 175° C. | | | — | 0.015 | 0.025 | 0.020 | 0.029 | 0.028 |
| Change in relative permittivity at 100° C. to 175° C. | | | — | 0.04 | 0.05 | 0.04 | 0.08 | 0.08 |
| Glass transition temperature (Tg) | | | ° C. | 197 | 185 | 221 | 169 | 167 |
| Volume resistivity (25° C.) | | | Ω·m | 1.8E+12 | 1.6E+12 | 7.1E+11 | 1.7E+12 | 3.2E+11 |
| Volume resistivity (175° C.) | | | Ω·m | 4.5E+10 | 1.2E+09 | 1.4E+10 | 4.7E+09 | 3.2E+09 |
| Total amount of ions | | | ppm | 12700 | 8390 | 19500 | 17500 | 16500 |
| Insulation reliability evaluation | | | — | A | B | B | C | C |

| | | | Example 6 | Example 7 | Comparative Example 1 | Comparative Example 2 | Comparative Example 3 |
|---|---|---|---|---|---|---|---|
| Resin composition | Thermosetting resin | Epoxy resin 1 | — | — | — | — | 18.9 |
| | | Epoxy resin 2 | — | 12.9 | — | — | — |
| | | Epoxy resin 3 | — | — | — | — | — |
| | | Epoxy resin 4 | — | — | — | — | — |
| | | Epoxy resin 5 | — | — | — | — | — |
| | | Epoxy resin 6 | 18.4 | — | — | — | — |
| | | Epoxy resin 7 | — | — | 16.8 | — | — |
| | | Epoxy resin 8 | — | — | — | 17.4 | — |
| | | Cyanate resin 1 | — | 12.9 | — | — | — |
| | Curing agent | Phenol-based curing agent 1 | 7.8 | — | 9.4 | 8.9 | 7.3 |
| | | Curing catalyst 1 | 0.1 | — | 0.1 | 0.1 | 0.1 |
| | | Curing catalyst 2 | — | 0.5 | — | — | — |
| | Inorganic fillers | Fillers 1 | 73.8 | 73.8 | 73.8 | 73.8 | 73.8 |
| Maximum value of dielectric loss ratio at 100° C. to 175° C. | | | 0.025 | 0.010 | 0.035 | 0.032 | 0.034 |
| Change in relative permittivity at 100° C. to 175° C. | | | 0.05 | 0.03 | 0.18 | 0.015 | 0.14 |
| Glass transition temperature (Tg) | | | 190 | 288 | 166 | 170 | 195 |
| Volume resistivity (25° C.) | | | 1.9E+12 | 1.8E+13 | 1.4E+12 | 1.1E+12 | 2.0E+12 |
| Volume resistivity (175° C.) | | | 2.7E+09 | 4.1E+11 | 7.5E+06 | 1.3E+07 | 9.7E+07 |
| Total amount of ions | | | 14000 | 19000 | 22000 | 20000 | 14700 |
| Insulation reliability evaluation | | | B | B | E | E | D |

The power modules of Examples 1 to 7 in which the substrates for a power module having a maximum value of the dielectric loss ratio at 100° C. to 175° C. and a change in the relative permittivity in the ranges of the present invention were used had excellent insulation reliability.

On the other hand, the power modules of Comparative Examples 1 to 3 in which the substrates for a power module having a maximum value of the dielectric loss ratio at 100° C. to 175° C. and a change in the relative permittivity outside the ranges of the present invention were used had poor insulation reliability.

This application claims priority on the basis of Japanese Patent Application No. 2015-146051 filed on Jul. 23, 2015, the content of which is fully incorporated herein by reference.

The invention claimed is:

1. A substrate for a power module comprising:
a metal substrate;
an insulating resin layer provided on the metal substrate; and
a metal layer provided on the insulating resin layer,
wherein the insulating resin layer includes a thermosetting resin and inorganic fillers dispersed in the thermosetting resin, and
a maximum value of a dielectric loss ratio of the insulating resin layer at a frequency of 1 kHz and 100° C. to 175° C. is equal to or less than 0.030, and a change in a relative permittivity is equal to or less than 0.10,
wherein a volume resistivity of the insulating resin layer at 175° C., which is on the basis of JIS K6911 and is measured one minute after the application of a voltage at an applied voltage of 1,000 V, is equal to or more than $1.0 \times 10^8$ Ω·m.

2. The substrate for a power module according to claim 1, wherein the maximum value of the dielectric loss ratio is equal to or less than 0.025, and the change in the relative permittivity is equal to or less than 0.05.

3. The substrate for a power module according to claim 1, wherein a total amount of ions in the insulating resin layer, which is measured by analyzing extracted water obtained under the following condition using an ion chromatograph is equal to or less than 30,000 ppm, and the ions are one or more selected from $Li^+$, $Na^+$, $NH_4^+$, $K^+$, $Ca^{2+}$, $Mg^{2+}$, $F^-$, $Cl^-$, $NO_2^{2-}$, $Br^-$, $NO_3^-$, $PO_4^{3-}$, $SO_4^{2-}$, $(COO)_2^{2-}$, $CH_3COO^-$, and $HCOO^-$ wherein the condition is: pure water (40 mL) is added to the frost-shattered insulating resin layer (2 g), and is extracted with a hot water at 125° C. for 20 hours, thereby obtaining extracted water.

4. The substrate for a power module according to claim 1, wherein the thermosetting resin is one or more selected from an epoxy resin having a dicyclopentadiene skeleton, an epoxy resin having a biphenyl skeleton, an epoxy resin having an adamantane skeleton, an epoxy resin having a phenol aralkyl skeleton, an epoxy resin having a biphenyl aralkyl skeleton, an epoxy resin having a naphthalene aralkyl skeleton, and a cyanate resin.

5. The substrate for a power module according to claim 1, wherein a glass transition temperature of the insulating resin layer, which is measured by a dynamic mechanical analysis under conditions of a temperature-increase rate of 5° C./min and a frequency of 1 Hz, is equal to or higher than 175° C.

6. The substrate for a power module according to claim 1, wherein the inorganic fillers are secondary agglomerated particles that are constituted of primary particles of scale-like boron nitride.

7. The substrate for a power module according to claim 6, wherein an average particle diameter of the secondary agglomerated particles is equal to or more than 5 μm and equal to or less than 180 μm.

8. The substrate for a power module according to claim 6, wherein an average long diameter of the primary particles constituting the secondary agglomerated particles is equal to or more than 0.01 μm and equal to or less than 20 μm.

9. The substrate for a power module according to claim 1, wherein a content of the inorganic fillers is equal to or more than 50% by mass and equal to or less than 95% by mass with respect to 100% by mass of the insulating resin layer.

10. The substrate for a power module according to claim 1, wherein the volume resistivity is equal to or more than $1.0 \times 10^9$ Ω·m.

11. The substrate for a power module according to claim 1, wherein a thickness of the metal layer is equal to or more than 0.25 mm and equal to or less than 1.0 mm.

12. The substrate for a power module according to claim 1, wherein metal constituting the metal layer includes copper.

13. The substrate for a power module according to claim 1, wherein a thickness of the metal substrate is equal to or more than 2.0 mm and equal to or less than 5.0 mm.

14. The substrate for a power module according to claim 1, wherein the metal substrate is a copper substrate.

15. A circuit board for a power module formed by carrying out a circuit process on the metal layer in the substrate for a power module according to claim 1.

16. A power module comprising:
the circuit board for a power module according to claim 15; and
an electronic component provided on the circuit board for a power module.

* * * * *